United States Patent [19]

Scovell et al.

[11] Patent Number: 4,755,487
[45] Date of Patent: Jul. 5, 1988

[54] METHOD FOR MAKING BIPOLAR TRANSISTORS USING RAPID THERMAL ANNEALING

[75] Inventors: Peter D. Scovell; Roger L. Baker, both of Chelmsford; David W. McNeil, Harlow, all of Great Britain

[73] Assignee: STC PLC, London, England

[21] Appl. No.: 904,547

[22] Filed: Sep. 8, 1986

[30] Foreign Application Priority Data

Sep. 21, 1985 [GB] United Kingdom ............... 8523369

[51] Int. Cl.[4] ............................................ H01L 21/324
[52] U.S. Cl. .................................... 437/247; 437/239; 437/174; 437/31; 148/DIG. 10
[58] Field of Search ............... 148/1.5, 187, DIG. 90; 357/34, 59; 29/571; 437/247, 15, 16, 17, 18, 19, 20, 21, 31, 32, 174, 239, 238

[56] References Cited

U.S. PATENT DOCUMENTS 4,181,538 1/1980 Narayan et al. .................... 148/1.5
4,523,370 6/1985 Sullivan et al. .................... 29/576 B

OTHER PUBLICATIONS

Schaber et al., "Conduction Mechanisms of Polysilicon emitters with thin Interfacial Oxide Layers", in *IEDM*, 1984, pp. 738–741.
Hodgson et al., "RTA of Si Warp an Ultrahigh Power Arc Lamp", in *Mat. Res. Soc. Symp. Proc.*, vol. 13 (1983), Elsevier Sci., pp. 355–360.
Narayan et al, "Flame annealing of Ion Implanted Silicon", in *Mat. Res. Soc. Symp. Proc.*, vol. 13 (1983), Elsevier Sci., pp. 361–367.
Hill, C., "The Contribution of . . . ", in *Mat. Res. Soc. Proc.*, vol. 13 (1983), Elsevier Sci., pp. 381–392.
Cuthbertson et al., "Self-Aligned Bipolar Transistors with Enhanced Efficiency Polysilicon Emitters", in 1984, IEDM, pp. 749–752.
Peterson, K., *IBM Technical Disclosure Bulletin*, vol. 22, No. 11, Apr. 1980, pp. 5053–5054.
Ning et al., *IEEE Transactions on Electron Dervices*, vol. ED-27, No. 11, Nov. 1980, pp. 2051–2055.

*Primary Examiner*—Brian E. Hearn
*Assistant Examiner*—T. N. Quach
*Attorney, Agent, or Firm*—Lee & Smith

[57] ABSTRACT

In making bipolar transistors, an interfacial oxide layer (5) is formed over ther monocrystalline region (1), and polysilicon (6) is formed both thereon as an extrinsic emitter region. After doping the polysilicon a monocrystalline emitter region (4) is produced in the base region by diffusion from the extrinsic polysilicon emitter region. The oxide layer (5) acts as a diffusion barrier to ensure that excessive dopant does not reach the monocrystalline region.

After the above operation, a thermal treatment is effected at a higher temperature, e.g. 1100° C., for a few seconds, which breaks down the interfacial oxide layer referred to above. This temporary use of the interfacial oxide layer leads to better and more consistant transistor characteristics.

1 Claim, 1 Drawing Sheet

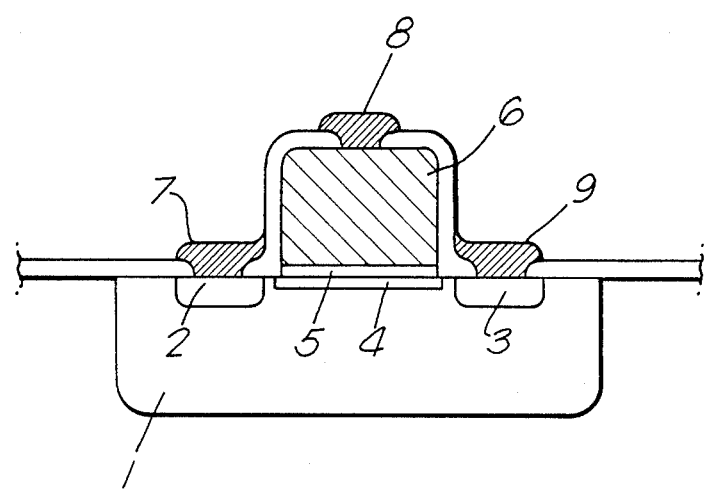

METHOD FOR MAKING BIPOLAR TRANSISTORS USING RAPID THERMAL ANNEALING

FIELD OF THE INVENTION

This invention relates to the production of silicon transistors, especially in integrated circuits.

BACKGROUND OF THE INVENTION

Thin oxides in the thickness range between 1 and 3 lnm are used in various transistor production methods, e.g. during the fabrication of polysilicon emitter devices. Such thin layers of silicon oxide have been used to modify the electrical performance of the device, and have been believed to prevent back-injection of the holes (or electrons) from the base into the emitter in an NPN (or PNP) device, thus improving the emitter efficiency and hence the gain. In application No. 831265, P. D. Scovell and R. L. Baker, filed Feb. 20th, 1986, abandoned and assigned to the same assignee as the present application, we have described a method for growing such layers, which method includes pulse-heating the semiconductor in an oxidising atmosphere to a peak temperature exceeding 500° C.

The present invention has as its object an extension of the usefulness of such an oxide layer.

SUMMARY OF THE INVENTION

According to the invention, there is provided a method of making a transistor, which includes applying an interfacial oxide layer to a monocrystalline base region of the transistor, depositing a polysilicon region over the interfacial oxide region, doping it with, for example, arsenic or phosphorous, to form an extrinsic emitter region, the oxide region acting as a barrier between the monocrystalline region and the polysilicon to prevent excessive emitter dopant diffusion into the monocrystalline region during a low-temperature drive-in, and then applying thermal treatment to the transistor for a short period, the higher temperature used in this thermal treatment and the duration thereof being such as to substantially eliminate the interfacial region.

BRIEF DESCRIPTION OF THE DRAWING

An example of a process embodying the invention will now be described with reference to the accompanying drawing, which is a schematic representation—not to scale—of a transistor made by such a process at an intermediate stage in the process.

DESCRIPTION OF THE PREFERRED EMBODIMENT

In the drawing we see a p-type base region 1, into which p+ regions 2, 3, are formed, one on each side of a polycrystalline emitter region 4. Over the base region there is a thin interfacial oxide layer 5, of the order of 1 to 3 nm in thickness. The polysilicon n+ region 6, which is patterned on the device after the implantation is used to align the p+ regions 3. This region 6 is doped with, for instance, arsenic or phosphorous. Underneath the oxide layer 5 there is a thin monocrystalline emitter region 4 which is formed by diffusion of emitter dopant from the polysilicon through the oxide layer, 5. The other shaded areas 7, 8, 9 are contacts to the device.

During the fabrication process, the oxide film 5 is produced overlaying the monocrystalline base region 1, and the polycrystalline emitter region 6 is then patterned on the oxide film. It is after this that the region 6 is doped as mentioned above. Then a drive-in is carried out which forms the shallow monocrystalline emitter region 4. The term drive-in means that the dopant needed for the emitter is driven in to the base region 1. The oxide film 5 retards the emitter dopant diffusion thus keeping the region 4 shallow.

After the stage shown in the drawing has been reached, a further operation is effected to render the oxide layer ineffective since it is no longer needed. To do this a thermal treatment at 1100° C. is used, lasting typically for a few seconds, which ensures complete breakdown of the film.

Thus it will be seen that the film is used only during the earlier fabrication step, when the film prevents excessive in-diffusion of the emitter dopant from the polysilicon emitter region into the monocrystalline region. This emitter dopant is implanted and subsequently driven in at 900° C., and quickly distributes itself through the polysilicon, but is retarded by the thin oxide layer, which is intact at such a temperature. This allows accurate control of diffusion of the emitter dopant into the very shallow monocrystalline region. This is desirable to ensure that the device has a satisfactory performance. Since the film is deliberately destroyed before final device encapsulation, less variation in the gain or other properties of the device occur than in processes where the oxide remains intact.

The process sequence at the interfacial stage commences with gate oxidation, whereafter a photo-lithographic step is effected to define the region of the semiconductor substrate at which transistors are to be formed. This reference to gate oxidation, which refers specifically to the interfacial stage of the process sequence, is included to define the position in the full process sequence at which the interfacial treatment occurs. Then the base region is formed by ion implantation, whereafter the resist used in the photo-step is stripped away. This is followed by a photo-lithographic step to define the regions in which interfacial oxides are to be produced. Thus the oxide etch is effected followed by another resist strip. This is followed by heat treatment as mentioned above to produce the interfacial oxide, after which polysilicon deposition is effected.

What is claimed is:

1. In a method of making the emitter region of a transistor, the steps of:
    applying an interfacial oxide layer to a monocrystalline base region of the transistor;
    depositing a polysilicon region over the interfacial oxide layer to form an extrinsic emitter region;
    doping the polysilicon region with arsenic or phosphorus, wherein the oxide region acts as a barrier between the monocrystalline base region and the polysilicon to retard the diffusion of the emitter dopant into the monocrystalline region during a low-temperature diffusion drive-in, thus preventing excessive diffusion of the emitter dopant into the monocrystalline region; and
    applying thermal treatment to the base region and the emitter region for a short period, on the order of a few seconds;
    wherein the higher temperature used in said thermal treatment and the duration thereof, of the order of a few seconds, are such as to substantially eliminate the interfacial region; and
    wherein the low temperature at which said diffusion drive-in is effected is 900° C. and the higher temperature used by said thermal treatment to eliminate the interfacial oxide region is 1100° C.

* * * * *